United States Patent
Jiang et al.

(10) Patent No.: US 10,191,582 B2
(45) Date of Patent: Jan. 29, 2019

(54) TERMINAL WITH TOUCH CONTROL BUTTON

(71) Applicant: Xiaomi Inc., Beijing (CN)

(72) Inventors: Zhongsheng Jiang, Beijing (CN); Kun Yang, Beijing (CN); Jun Tao, Beijing (CN)

(73) Assignee: XIAOMI INC., Haidian District, Beijing (CN)

( * ) Notice: Subject to any disclaimer, the term of this patent is extended or adjusted under 35 U.S.C. 154(b) by 23 days.

(21) Appl. No.: 15/339,941

(22) Filed: Nov. 1, 2016

(65) Prior Publication Data

US 2017/0131830 A1 May 11, 2017

(30) Foreign Application Priority Data

Nov. 5, 2015 (CN) .......................... 2015 1 0744861

(51) Int. Cl.
*H03K 17/96* (2006.01)
*G06F 3/041* (2006.01)
*G06F 3/044* (2006.01)

(52) U.S. Cl.
CPC ............ *G06F 3/0416* (2013.01); *G06F 3/041* (2013.01); *G06F 3/044* (2013.01); *H03K 17/962* (2013.01);
(Continued)

(58) Field of Classification Search
CPC .... G06F 3/0416; G06F 3/044; G06F 3/04883; G06F 3/041; G06F 3/0487; H03K 17/962;
(Continued)

(56) References Cited

U.S. PATENT DOCUMENTS

2011/0090169 A1* 4/2011 Karhiniemi ......... G06F 3/04883
345/173
2012/0098760 A1 4/2012 Chuang
(Continued)

FOREIGN PATENT DOCUMENTS

CN 102023772 A 4/2011
CN 102214031 A 10/2011
(Continued)

OTHER PUBLICATIONS

International Search Report for PCT application No. PCT/CN2016/101192 dated Nov. 30, 2016.
(Continued)

*Primary Examiner* — Richard Hong
(74) *Attorney, Agent, or Firm* — Jun He Law Offices P.C.; James J. Zhu

(57) ABSTRACT

A terminal is provided. The terminal includes a processor and a touch control button, and the touch control button includes a touch control sensor and a button cover plate. The button cover plate is located above a sensor sheet of the touch control sensor. The processor is electrically connected to the touch control sensor and is configured to acquire a detection signal value of the touch control sensor, wherein the detection signal value of the touch control sensor increases as a sensing area of the sensor sheet increases. The processor is further configured to determine a control instruction according to pre-stored corresponding relationships between detection signal values and control instructions and to execute the control instruction.

13 Claims, 3 Drawing Sheets

(52) U.S. Cl.
CPC .............. *H03K 2017/9602* (2013.01); *H03K 2217/960755* (2013.01); *H03K 2217/960785* (2013.01)

(58) Field of Classification Search
CPC .......... H03K 2017/9602; H03K 2217/960755; H03K 2217/960785
See application file for complete search history.

(56) References Cited

U.S. PATENT DOCUMENTS

| | | | | |
|---|---|---|---|---|
| 2014/0327635 A1* | 11/2014 | Huang | .................. | G06F 3/0487 345/173 |
| 2017/0075483 A1* | 3/2017 | Ling | ....................... | G06F 3/044 |
| 2017/0269723 A1* | 9/2017 | Wang | ...................... | G06F 3/041 |

FOREIGN PATENT DOCUMENTS

| | | |
|---|---|---|
| CN | 102479040 A | 5/2012 |
| CN | 103186261 A | 7/2013 |
| CN | 105302245 A | 2/2016 |
| WO | 2009150285 A1 | 12/2009 |

OTHER PUBLICATIONS

Extended European Search Report of EP application No. 16197088.4, dated Apr. 10, 2017.

* cited by examiner

TERMINAL WITH TOUCH CONTROL BUTTON

CROSS REFERENCE TO RELATED APPLICATION

This application is based on and claims priority to Chinese Patent Application No. 201510744861.5, filed on Nov. 5, 2015, the entire contents of which are incorporated herein by reference.

TECHNICAL FIELD

The present disclosure relates to a field of electronic technology, and more particularly to a terminal with a touch control button.

BACKGROUND

With the development of electronic technology, a mobile terminal such as a cell phone is widely used and becomes a significant tool for people communication. Functions of the terminal become more and more abundant. Some functions of the terminal may be controlled by a button in the terminal. Typically, there are three touch control buttons set below a screen: a menu button, a return button and a Home button (a button for returning to desktop) respectively, and functions corresponding to the touch control buttons are different.

Typically, an antenna for communication in the terminal is set along with the bottom edge of the terminal, and it needs to leave a clearance zone of a certain size around the antenna. The efficiency of the antenna may be decreased if a semiconductor is set in the clearance zone. For a terminal with the antenna set in the bottom-side, the clearance zone is a bar zone lying a certain distance above the bottom edge. For aesthetic reasons, a distance between the bottom edge of the terminal and the screen is minimized when designing the terminal, such that the three touch control buttons in the terminal may locate in the clearance zone, which may lead to a lower efficiency of the antenna.

SUMMARY

According to a first aspect of embodiments of the present disclosure, a terminal is provided. The terminal includes a processor and a touch control button. The touch control button includes a touch control sensor and a button cover plate, and the button cover plate is located above a sensor sheet of the touch control sensor. The processor is electrically connected to the touch control sensor and is configured to acquire a detection signal value of the touch control sensor, and the detection signal value of the touch control sensor increases as a sensing area of the sensor sheet increases. The processor is further configured to determine a control instruction according to pre-stored corresponding relationships between detection signal values and control instructions and to execute the control instruction.

It is to be understood that both the foregoing general description and the following detailed description are exemplary and explanatory only and are not restrictive of the disclosure.

BRIEF DESCRIPTION OF THE DRAWINGS

Accompanying drawings herein are incorporated in and constitute a part of the specification, and illustrate example embodiments in line with the present disclosure, and serve to explain the principle of the present disclosure together with the description.

Embodiments of the present disclosure are illustrated in the above accompany drawings and will be described in further detail hereinafter. These accompany drawings and literal description are not intended to limit the scope of the idea of the present disclosure, but to explain the principle of the present disclosure with reference to particular embodiments for those skilled in the art.

REFERENCE NUMBERS

| | |
|---|---|
| 1. processor | 2. touch control button |
| 21. touch control sensor | 22. button cover plate |
| 211. sensor sheet | 212. detection circuit |
| 2111. first sensor sheet | 2112. second sensor sheet |
| 2113. third sensor sheet | |

DETAILED DESCRIPTION

Reference will now be made in detail to exemplary embodiments, examples of which are illustrated in the accompanying drawings. The following description refers to the accompanying drawings in which the same numbers in different drawings represent the same or similar elements unless otherwise represented. The implementations set forth in the following description of exemplary embodiments do not represent all implementations consistent with the disclosure. Instead, they are merely examples of apparatuses and methods consistent with aspects related to the disclosure as recited in the appended claims.

Figure 1:
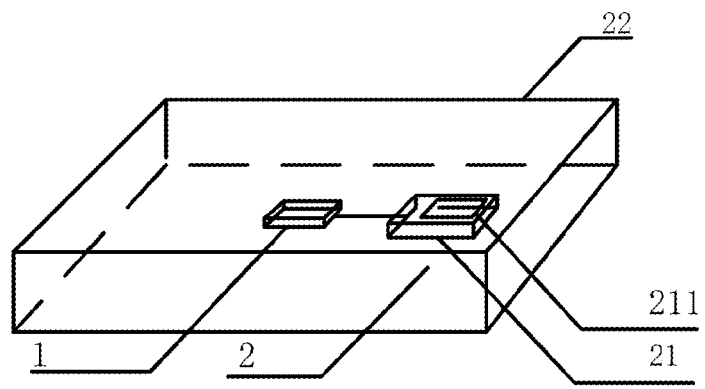
FIG. 1 is a schematic diagram of a terminal according to an example embodiment.

An embodiment of the present disclosure provides a terminal with a touch control button. As shown in FIG. 1, the terminal includes: a processor 1 and a touch control button 2. The touch control button 2 includes a touch control sensor 21 and a button cover plate 22, and the button cover plate 22 is located above a sensor sheet 211 of the touch control sensor 21. The processor 1 is electrically connected to the touch control sensor 21 and is configured to acquire a detection signal value of the touch control sensor 21, and the detection signal value of the touch control sensor 21 increases as a sensing area of the sensor sheet 211 increases. The processor is further configured to determine a control instruction corresponding to the detection signal value according to pre-stored corresponding relationships between detection signal values and control instructions, and to execute the control instruction corresponding to the detection signal value.

In this way, the terminal may realize more functions by using less touch control buttons, which means that the number of touch control buttons falling in the clearance zone may be reduced, so that the influence on efficiency of the antenna may be reduced.

Another embodiment of the present disclosure provides a terminal. As shown in FIG. 1, the terminal includes: a processor 1 and a touch control button 2, and the touch control button 2 includes a touch control sensor 21 and a button cover plate 22, and the button cover plate 22 is located above a sensor sheet 211 of the touch control sensor 21. The processor 1 is electrically connected to the touch control sensor 21 and is configured to acquire a detection signal value of the touch control sensor 21, and the detection signal value of the touch control sensor 21 increases as a sensing area of the sensor sheet 211 increases. The processor is further configured to determine a control instruction corresponding to the detection signal value according to pre-stored corresponding relationships between detection signal values and control instructions, and to execute the control instruction.

Figure 2:
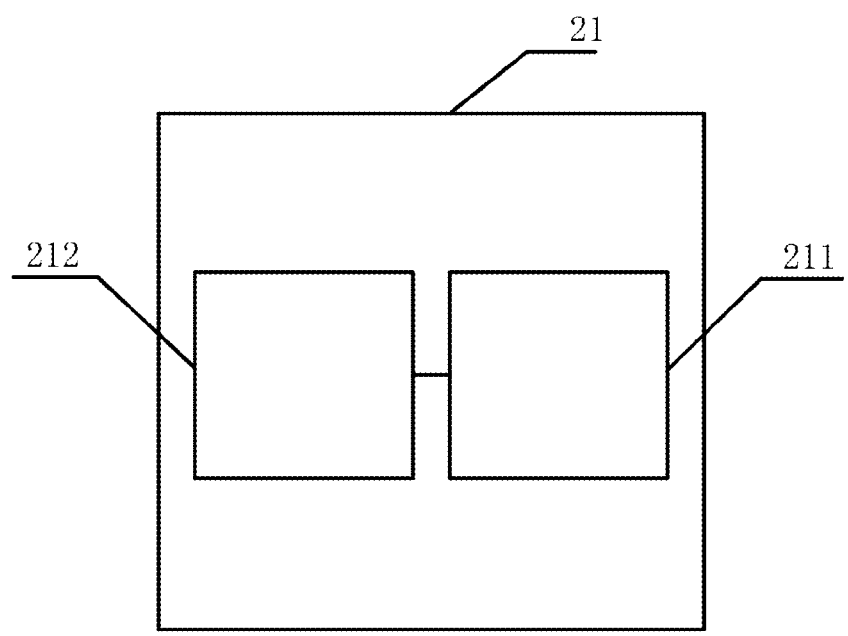
FIG. 2 is a schematic diagram of a touch control sensor according to an embodiment.

In this embodiment, the terminal may include the processor 1 and the touch control button 2. The touch control button 2 may be a capacitive touch control button, and may include the touch control sensor 21 and the button cover plate 22. If the button cover plate 22 is touched by a finger, the touch control sensor 21 may detect a detection signal value which may be a capacitance value or a voltage signal value. The terminal also includes a screen including a screen cover plate and a displaying component, in which the screen cover plate is located above the displaying component, and the button cover plate 22 and the screen cover plate may be integrated together, or may be two respective parts of a same plate. As shown in FIG. 2, the touch control sensor may include a sensor sheet 211 and a detection circuit 212, and the sensor sheet 211 may be a polar plate of a capacitor. The button cover plate 22 may be disposed above the sensor sheet 211 of the touch control sensor 21, and the sensor sheet 211 may sense a sensing area which is within a preset distance threshold from the sensor sheet 211. That is, the capacitance value of the capacitor may be changed if the distance between the finger of the user and the sensor sheet 211 is within the preset distance threshold and the finger is approaching to the button cover plate 22. The larger the touching area between the finger and the button cover plate 22, the greater the capacitance value of the capacitor. The distance between the sensor sheet 211 and the button cover plate 22 may be set as the preset distance threshold, thus the sensing area of the sensor sheet is the touching area between the finger and the button cover plate 22.

The processor 1 may be electrically connected to the touch control sensor 21, and may acquire the detection signal value from the touch control sensor 21. The detection signal value may be a capacitance value of a capacitor or a voltage signal value. The voltage signal value may change with the capacitance value of the capacitor. The processor 1 may determine an executable control instruction according to the detection signal value acquired from the touch control sensor 21, i.e., a function corresponding to the touch control button may be determined. Specifically, corresponding relationships between detection signal values and control instructions may be pre-stored, and a control instruction corresponding to the detection signal value may be determined in the corresponding relationships after the detection signal value of the touch control sensor 21 is acquired, and the control instruction corresponding to the detection signal value may be executed. The detection signal value of the touch control sensor 21 increases as a sensing area of the sensor sheet 211 increases, which means that the larger the touching area between the finger of the user and the button cover plate 22, the greater the detection signal value of the touch control sensor 21, i.e., the function corresponding to the touch control button may varies with the sensing area of the sensor sheet.

In some embodiments, the terminal includes one touch control button.

Thus, the area of the conductor in the clearance zone may be reduced, so that an influence on efficiency of the antenna may be reduced.

Alternatively, the touch control sensor 21 includes at least two sensor sheets, and the detection signal value of the touch control sensor 21 includes detection signal values corresponding to the at least two sensor sheets respectively.

In this embodiment, the touch control sensor 21 may include at least two sensor sheets, which means that the detection circuit 212 of the touch control sensor 21 may detect the detection signal values corresponding to the at least two sensor sheets respectively.

In some embodiments, the at least two sensor sheets are located on a same plane and are arranged in a surrounded structure from inside to outside, and are separated with each other.

In this embodiment, the at least two sensor sheets of the touch control sensor 21 are located on a same plane, and are arranged in a surrounded structure from inside to outside, and are separated in a certain distance with each other. When distributing the at least two sensor sheets included in the touch control sensor 21, one of the at least two sensor sheets is arranged at a center position, the other sensor sheets are arranged sequentially in a manner that multiple sensor sheets correspond to a same center. Thus, a misoperation may be avoided.

In some embodiments, a distance between adjacent sensor sheets of the at least two sensor sheets is greater than a preset distance threshold.

In this embodiment, the at least two sensor sheets are arranged in a surrounded structure from inside to outside, and the distance between adjacent sensor sheets of the at least two sensor sheets is greater than the preset distance threshold. Thus, a probability of misoperation may be reduced effectively.

Alternatively, the touch control sensor 21 includes three sensor sheets: a first sensor sheet 2111, a second sensor sheet 2112 and a third sensor sheet 2113, respectively. The first sensor sheet 2111, the second sensor sheet 2112 and the third sensor sheet 2113 are arranged sequentially from inside to outside in a surrounded structure.

Figure 3A:
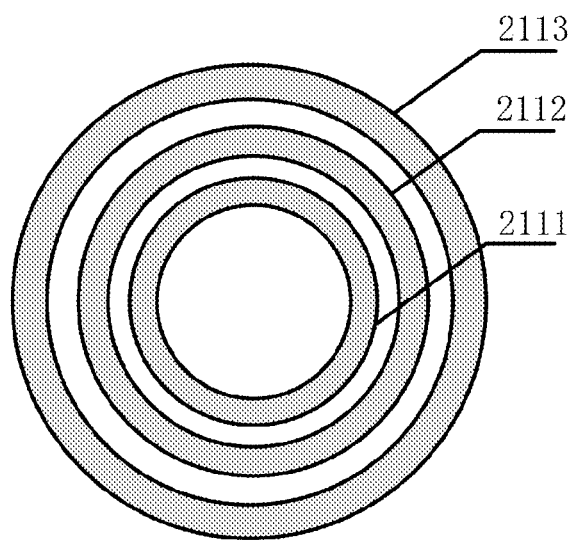
FIG. 3(a) is a schematic diagram of a sensor sheet according to an embodiment.
Figure 3B:
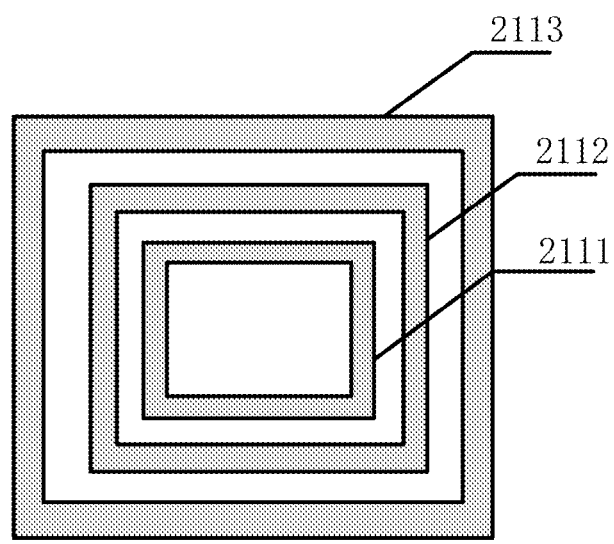
FIG. 3(b) is a schematic diagram of a sensor sheet according to an embodiment.
Figure 3C:
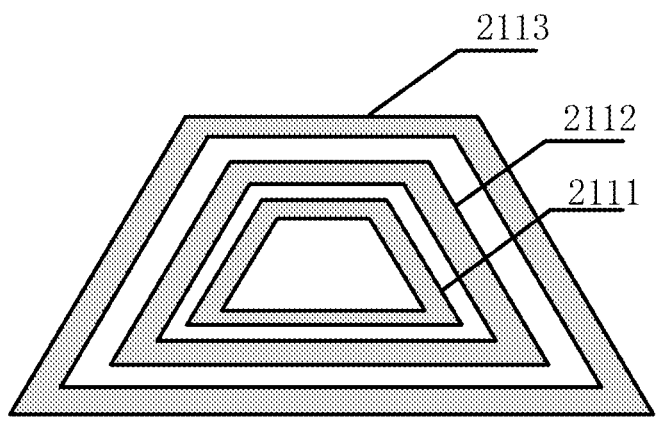
FIG. 3(c) is a schematic diagram of a sensor sheet according to an embodiment.

In this embodiment, the touch control sensor 21 includes three sensor sheets: the first sensor sheet 2111, the second sensor sheet 2112 and the third sensor sheet 2113, respectively. A shape of the sensor sheet may be a circular ring as shown in FIG. 3 (a), the shape of the sensor sheet may be a hollow rectangle as shown in FIG. 3 (b), or the shape of the sensor sheet may be a hollow trapezoid as shown in FIG. 3 (c). The shape of each sensor sheet of the touch control sensor 21 may be a closed ring. Alternatively, the shape of a sensor sheet other than the innermost sensor sheet in the surrounded structure may have an opening (i.e., not closed ring), so that the innermost sensor sheet in the surrounded structure may electrically connected to the detection circuit 212 via wires. Thus, it is convenient for the innermost sensor sheet to be electrically connected to the detection circuit 212 if the sensor sheets are located on a same plane with the detection circuit 212. The three sensor sheets are electrically connected with the detection circuit 212, and the detection signal value of the touch control sensor 21 includes detection signal values corresponding respectively to the three sensor sheets. That is, the detection circuit 212 of the touch control sensor 21 may detect the detection signal value corresponding to each sensor sheet. The three sensor sheets are arranged sequentially from inside to outside in a surrounded structure, in which the first sensor sheet 2111 is arranged in the center, the second sensor sheet 2112 and the third sensor sheet 2113 are arranged sequentially from inside to outside.

In some embodiments, the processor 1 is configured to acquire the detection signal value of the touch control sensor 21 and to execute a first preset control instruction if the detection signal value corresponding to the first sensor sheet 2111 of the touch control sensor 21 is greater than a first preset threshold, the detection signal value corresponding to the second sensor sheet 2112 of the touch control sensor 21 is not greater than a second preset threshold, and the detection signal value corresponding to the third sensor sheet 2113 of the touch control sensor 21 is not greater than a third preset threshold. Alternatively, the processor is configured to execute a second preset control instruction if the detection signal value corresponding to the first sensor sheet 2111 of the touch control sensor 21 is greater than a first preset threshold, the detection signal value corresponding to the second sensor sheet 2112 of the touch control sensor 21 is greater than a second preset threshold, and the detection signal value corresponding to the third sensor sheet 2113 of the touch control sensor 21 is not greater than a third preset threshold. Alternatively, the processor 1 is configured to execute a third preset control instruction if the detection signal value corresponding to the first sensor sheet 2111 of the touch control sensor 21 is greater than a first preset threshold, the detection signal value corresponding to the second sensor sheet 2112 of the touch control sensor 21 is greater than a second preset threshold, and the detection signal value corresponding to the third sensor sheet 2113 of the touch control sensor 21 is greater than a third preset threshold.

In this embodiment, the processor 1 is configured to acquire the detection signal value of the touch control sensor 21, and the detection signal value may be the detection signal values corresponding to the first sensor sheet, the second sensor sheet and the third sensor sheet, respectively. It is judged whether the detection signal value corresponding to each sensor sheet reaches a corresponding preset threshold after acquiring the current detection signal value, i.e., to determine the control instruction corresponding to the current detection signal value. Specifically, a first threshold, a second threshold, a third threshold and corresponding relationships between detection signal values (including detection signal value corresponding to each sensor sheet) and control instructions may be pre-stored, and the control instruction to be executed may be determined according to the corresponding relationships. That is, the first preset control instruction may be executed if the detection signal value corresponding to the first sensor sheet 2111 of the touch control sensor 21 is greater than the first preset threshold, the detection signal value corresponding to the second sensor sheet 2112 of the touch control sensor 21 is not greater than the second preset threshold, and the detection signal value corresponding to the third sensor sheet 2113 of the touch control sensor 21 is not greater than the third preset threshold. The second preset control instruction may be executed if the detection signal value corresponding to the first sensor sheet 2111 of the touch control sensor 21 is greater than the first preset threshold, the detection signal value corresponding to the second sensor sheet 2112 of the touch control sensor 21 is greater than the second preset threshold, and the detection signal value corresponding to the third sensor sheet 2113 of the touch control sensor 21 is not greater than the third preset threshold. The third preset control instruction may be executed if the detection signal value corresponding to the first sensor sheet 2111 of the touch control sensor 21 is greater than the first preset threshold, the detection signal value corresponding to the second sensor sheet 2112 of the touch control sensor 21 is greater than the second preset threshold, and the detection signal value corresponding to the third sensor sheet 2113 of the touch control sensor 21 is greater than the third preset threshold. The first preset threshold, the second preset threshold and the third preset threshold may be a same value, or may be different values, or may be set according to the sensing area of the corresponding sensor sheet. For example, for a sensor sheet with larger area, the corresponding threshold of the detection signal value of the touch control sensor is greater. Thus, a probability of misoperation may be reduced.

Alternatively, the touch control sensor includes a preset number of sensor sheets, and the processor is configured to acquire the detection signal value corresponding to each sensor sheet of the touch control sensor 21. The processor is configured to determine, in the sensor sheets of the touch control sensor 21, the number of the sensor sheets which are arranged continuously outwardly by an innermost sensor sheet and whose corresponding detection signal values are greater than a fourth threshold. Further, the processor is configured to determine the control instruction corresponding to a number range into which the number falls according to pre-stored corresponding relationships between number ranges and control instructions, and to execute the control instruction.

In this embodiment, the touch control sensor may include a plurality of sensor sheets, and the number of the plurality of sensor sheets may be more than the number of functions the touch control button 2 may realize. The processor 1 may acquire the detection signal value corresponding to each sensor sheet of the touch control sensor 21, and determine the number of the sensor sheets which are arranged continuously outwardly by an innermost sensor sheet and whose corresponding detection signal values are greater than a fourth threshold. For example, the touch control sensor 21 may include thirty sensor sheets, and may realize three functions. The innermost sensor sheet is the first sensor sheet, and the remaining sensor sheets are arranged sequentially from inside to outside. Thus, the outermost sensor sheet is the thirtieth sensor sheet. The processor may acquire the detection signal value corresponding to each of the thirty sensor sheets, and determine the magnitude relation between each detection signal value acquired and the fourth threshold, and determine the number of the sensor sheets which are arranged continuously outwardly by an innermost sensor sheet and whose corresponding detection signal values are greater than a fourth threshold (for example, if the detection signal values corresponding to the first sensor sheet, the second sensor sheet, the third sensor sheet and the fifth sensor sheet are greater than the fourth threshold and the detection signal value corresponding to the fourth sensor sheet is not greater than the fourth threshold, then it is determined that the number of the continuously distributed sensor sheets is three). After the number of the sensor sheets is determined, the processor may determine the number range into which the number falls included in the pre-stored corresponding relationships, and acquire the number range including the number and determine the control instruction corresponding to the number range according to the pre-stored corresponding relationships between number ranges and control instructions, and execute the control instruction. Thus, a probability of misoperation may be reduced.

In some embodiments, an indication icons is set on a position corresponding to each of the at least two sensor sheets on the button cover plate 22.

In this embodiment, an indication icon is set on a position corresponding to each sensor sheet on the button cover plate 22. Thus, a probability of misoperation may be reduced by promoting a user.

In some embodiments, a position of the button cover plate 22 corresponding to each of the at least two sensor sheets is transparent, and other positions of the button cover plate are nontransparent. Also, a light emitting diode is set between the at least two sensor sheets and the button cover plate.

Figure 4:
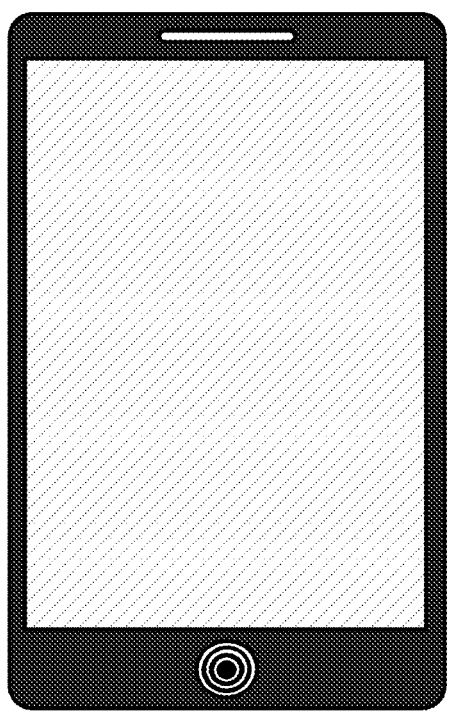
FIG. 4 is a schematic diagram of a terminal according to an embodiment.

As shown in FIG. 4, a black substance may be applied at a position other than the position corresponding to each sensor sheet on the back side of the button cover plate, such as graphite, such that the position corresponding to each sensor sheet is transparent. A light emitting diode is set between a sensor sheet and the button cover plate, thus the position corresponding to each sensor sheet on the button cover plate 22 is in a lighting state. Alternatively, the position corresponding to each sensor sheet is in a lighting state when the terminal is working. Thus, a user is prompted the position of the sensor sheet, reducing a probability of misoperation.

In the embodiments of the present disclosure, the terminal includes a processor and a touch control button. The touch control button includes a touch control sensor and a button cover plate, and the button cover plate is located above a sensor sheet of the touch control sensor. The processor is electrically connected to the touch control sensor and is configured to acquire a detection signal value of the touch control sensor, and the detection signal value of the touch control sensor increases as a sensing area of the sensor sheet increases. The processor is further configured to determine a control instruction corresponding to the current detection signal value according to pre-stored corresponding relationships between detection signal values and control instructions, and to execute the control instruction. Thus, the terminal may realize more functions by using less touch control buttons. That is, the number of touch control buttons falling in the clearance zone may be reduced, so that the influence on efficiency of the antenna may be reduced.

Other embodiments of the invention will be apparent to those skilled in the art from consideration of the specification and practice of the invention disclosed here. This application is intended to cover any variations, uses, or adaptations of the invention following the general principles thereof and including such departures from the present disclosure as come within known or customary practice in the art. It is intended that the specification and examples be considered as exemplary only, with a true scope and spirit of the invention being indicated by the following claims.

It will be appreciated that the present invention is not limited to the exact construction that has been described above and illustrated in the accompanying drawings, and that various modifications and changes can be made without departing from the scope thereof. It is intended that the scope of the invention only be limited by the appended claims.

What is claimed is:

1. A terminal, comprising:
   a touch control button having a touch control sensor and a button cover plate, the button cover plate being located above a sensor sheet of the touch control sensor;
   a processor electrically connected to the touch control sensor and configured to:
      acquire a detection signal value of the touch control sensor, wherein the detection signal value of the touch control sensor increases as a sensing area of the sensor sheet increases, and a function of the touch control button varies with the sensing area of the sensor sheet;
      determine a control instruction corresponding to a function of the touch control button according to pre-stored corresponding relationships between detection signal values and control instructions corresponding to different functions of the touch control button; and
      execute the control instruction;
   wherein the terminal comprises one touch control button, the touch control sensor comprises at least two sensor sheets, and the detection signal value of the touch control sensor comprises detection signal values corresponding to the at least two sensor sheets respectively;
   wherein an indication icon is set on a position corresponding to each of the at least two sensor sheets on the button cover plate.

2. The terminal according to claim 1, wherein the at least two sensor sheets are located on a same plane and are arranged in a surrounded structure from inside to outside, and are separated with each other.

3. The terminal according to claim 2, wherein a distance between adjacent sensor sheets of the at least two sensor sheets is greater than a preset distance threshold.

4. The terminal according to claim 2, wherein the touch control sensor comprises three sensor sheets: a first sensor sheet, a second sensor sheet and a third sensor sheet, respectively;
   the first sensor sheet, the second sensor sheet and the third sensor sheet are arranged sequentially from inside to outside in a surrounded structure.

5. The terminal according to claim 4, wherein the processor is configured to:
   execute a first preset control instruction responsive to the detection signal value corresponding to the first sensor sheet of the touch control sensor being greater than a first preset threshold, the detection signal value corresponding to the second sensor sheet of the touch control sensor being not greater than a second preset threshold, and the detection signal value corresponding to the third sensor sheet of the touch control sensor being not greater than a third preset threshold.

6. The terminal according to claim 4, wherein the processor is configured to:
   execute a second preset control instruction responsive to the detection signal value corresponding to the first sensor sheet of the touch control sensor being greater than the first preset threshold, the detection signal value corresponding to the second sensor sheet of the touch control sensor being greater than the second preset threshold, and the detection signal value corresponding to the third sensor sheet of the touch control sensor being not greater than the third preset threshold.

7. The terminal according to claim 4, wherein the processor is configured to:

execute a third preset control instruction responsive to the detection signal value corresponding to the first sensor sheet of the touch control sensor being greater than the first preset threshold, the detection signal value corresponding to the second sensor sheet of the touch control sensor being greater than the second preset threshold, and the detection signal value corresponding to the third sensor sheet of the touch control sensor being greater than the third preset threshold.

8. The terminal according to claim 2, wherein the touch control sensor comprises a preset number of sensor sheets, and the processor is configured to:
acquire the detection signal value corresponding to each sensor sheet of the touch control sensor;
determine, in the sensor sheets of the touch control sensor, the number of the sensor sheets which are arranged continuously outwardly by an innermost sensor sheet and whose corresponding detection signal values exceed a fourth threshold;
determine the control instruction corresponding to a number range into which the number falls according to pre-stored corresponding relationships between number ranges and control instructions; and
execute the control instruction.

9. The terminal according to claim 1, wherein a shape of the sensor sheet of the at least two sensor sheets is a circular ring.

10. The terminal according to claim 1, wherein a shape of the sensor sheet of the at least two sensor sheets is a hollow rectangle.

11. The terminal according to claim 1, wherein a shape of the sensor sheet of the at least two sensor sheets is a hollow trapezoid.

12. The terminal according to claim 1, wherein a position of the button cover plate corresponding to each of the at least two sensor sheets is transparent, and a position of the button cover plate other than the position corresponding to each sensor sheet is nontransparent;
a light emitting diode is set between the at least two sensor sheets and the button cover plate.

13. A terminal, comprising:
a touch control button having a touch control sensor and a button cover plate, the button cover plate being located above a sensor sheet of the touch control sensor;
a processor electrically connected to the touch control sensor and configured to:
acquire a detection signal value of the touch control sensor, wherein the detection signal value of the touch control sensor increases as a sensing area of the sensor sheet increases, and a function of the touch control button varies with the sensing area of the sensor sheet;
determine a control instruction corresponding to a function of the touch control button according to pre-stored corresponding relationships between detection signal values and control instructions corresponding to different functions of the touch control button; and
execute the control instruction;
wherein the terminal comprises one touch control button, the touch control sensor comprises at least two sensor sheets, and the detection signal value of the touch control sensor comprises detection signal values corresponding to the at least two sensor sheets respectively;
wherein the at least two sensor sheets are located on a same plane and are arranged in a surrounded structure from inside to outside, and are separated with each other;
wherein the touch control sensor comprises a preset number of sensor sheets, and the processor is configured to:
acquire the detection signal value corresponding to each sensor sheet of the touch control sensor;
determine, in the sensor sheets of the touch control sensor, the number of the sensor sheets which are arranged continuously outwardly by an innermost sensor sheet and whose corresponding detection signal values exceed a fourth threshold;
determine the control instruction corresponding to a number range into which the number falls according to pre-stored corresponding relationships between number ranges and control instructions; and
execute the control instruction.

* * * * *